(12) United States Patent
Ruiz

(10) Patent No.: US 11,631,148 B2
(45) Date of Patent: Apr. 18, 2023

(54) SMART METER MODULES AND ASSEMBLIES

(71) Applicant: CommScope Technologies LLC, Hickory, NC (US)

(72) Inventor: Guilibaldo Ruiz, McKinney, TX (US)

(73) Assignee: CommScope Technologies LLC, Hickory, NC (US)

( * ) Notice: Subject to any disclaimer, the term of this patent is extended or adjusted under 35 U.S.C. 154(b) by 199 days.

(21) Appl. No.: 17/147,515

(22) Filed: Jan. 13, 2021

(65) Prior Publication Data

US 2021/0264544 A1 Aug. 26, 2021

Related U.S. Application Data

(60) Provisional application No. 62/980,703, filed on Feb. 24, 2020.

(51) Int. Cl.
*G06Q 50/06* (2012.01)
*G01R 22/06* (2006.01)
*H04W 4/70* (2018.01)

(52) U.S. Cl.
CPC ........... *G06Q 50/06* (2013.01); *G01R 22/063* (2013.01); *H04W 4/70* (2018.02)

(58) Field of Classification Search
CPC .... G06Q 50/06; G01R 22/063; G01R 22/065; H04W 4/70
See application file for complete search history.

(56) References Cited

U.S. PATENT DOCUMENTS 9,497,098 B2 * 11/2016 Sybesma ............... H04L 43/062
2005/0122094 A1 6/2005 Robinson
2005/0270016 A1 12/2005 Karanam
2006/0232433 A1 10/2006 Holle et al.
2016/0252367 A1 * 9/2016 Banhegyesi ........... G01D 4/002
340/870.02

FOREIGN PATENT DOCUMENTS

KR 20170002457 U 7/2017

OTHER PUBLICATIONS

PCT Notification of Transmittal of the International Search Report and the Written Opinion of the International Searching Authority, or the Declaration, dated May 6, 2021, for corresponding PCT International Application No. PCT/US2021/013150.

* cited by examiner

*Primary Examiner* — Manuel A Rivera Vargas
(74) *Attorney, Agent, or Firm* — Myers Bigel, P.A.

(57) ABSTRACT

The present disclosure describes smart meter modules. A smart meter module may include a support frame and an outer cover. The support frame includes a top mounting plate, a bottom mounting plate, and an inner bracket between the top and bottom mounting plates and coupled thereto. The top mounting plate is spaced apart a distance from the bottom mounting plate to form an interior space of the module. The inner bracket has a central aperture that is generally perpendicular relative to the top and bottom mounting plates and configured to receive and secure a smart meter within the interior space of the module. The outer cover is configured to be secured to the inner bracket and sized to extend circumferentially around the interior space of the module. One or more elongated mounting apertures in the bottom mounting plate are configured such that the smart meter module can be secured to the top of a mounting pole. Smart meter module assemblies are also provided.

20 Claims, 9 Drawing Sheets

SMART METER MODULES AND ASSEMBLIES

RELATED APPLICATION(S)

The present application claims priority from and the benefit of U.S. Provisional Patent Application No. 62/980,703, filed Feb. 24, 2020, the disclosure of which is hereby incorporated herein in its entirety.

FIELD

The present application is directed generally toward telecommunications equipment, and more particularly, modules for a smart meter and related assemblies.

BACKGROUND

Digital "smart" meters are starting to replace older analog meters used to record electrical usage. This form of smart grid technology records consumption of electric energy and communicates the information (e.g., wirelessly) back to the utility supplier on a much more frequent schedule than the analog meters, which require a meter reader to transmit the information. In some instances, smart meters may be used to record energy consumption of telecommunication devices (e.g., radios and/or antennas). However, many of the currently available smart meters are not designed to be installed on top of a mounting structure, such as, on top of a pole.

SUMMARY

A first aspect of the present invention is directed to a smart meter module. The smart meter module includes a support frame and an outer cover. The support frame includes a top mounting plate, a bottom mounting plate, and an inner bracket between the top and bottom mounting plates and coupled thereto. The top mounting plate has a first routing aperture located in the center of the plate and a first plurality of elongated apertures located circumferentially around the first routing aperture. The bottom mounting plate has a corresponding second routing aperture in the center of the plate and a second plurality of elongated apertures located circumferentially around the second routing aperture. The top mounting plate is spaced apart a distance from the bottom mounting plate to form an interior space of the module. The inner bracket has a central aperture that is generally perpendicular relative to the top and bottom mounting plates and configured to receive and secure a smart meter within the interior space of the module. The outer cover is configured to be secured to the inner bracket and sized to extend circumferentially around the interior space of the module. One or more of the elongated apertures of the bottom mounting plate are configured such that the smart meter module can be secured to the top of a mounting pole.

Another aspect of the present invention is directed to a smart meter module. The smart meter module includes a support frame and an outer cover. The support frame includes a top mounting plate, a bottom mounting plate, and an inner bracket between the top and bottom mounting plates and coupled thereto. The top mounting plate has a first routing aperture located in the center of the plate and a first plurality of elongated apertures located circumferentially around the first routing aperture. The bottom mounting plate has a corresponding second routing aperture in the center of the plate and a second plurality of elongated apertures located circumferentially around the second routing aperture. The top mounting plate is spaced apart a distance from the bottom mounting plate to form an interior space of the module. The inner bracket includes a main body and two arms. The main body is generally perpendicular relative to the top and bottom mounting plates and has a central aperture configured to receive and secure a smart meter within the interior space of the module. The two arms extend rearwardly and generally perpendicularly from opposing ends of the main body. Each arm includes an outer cover section comprising a plurality of apertures configured to receive a fastener, and a mounting plate section comprising two flanges extending radially outwardly, each flange configured to be received by a respective slot in the top or bottom mounting plate. The outer cover is configured to be secured to the inner bracket and sized to extend circumferentially around the interior space of the module. One or more of the elongated apertures of the bottom mounting plate are configured such that the smart meter module can be secured to the top of a mounting pole.

Another aspect of the present invention is directed to a smart meter module. The smart meter module includes a support frame and an outer cover. The support frame includes a top mounting plate, a bottom mounting plate, and an inner bracket between the top and bottom mounting plates and coupled thereto. The top mounting plate has a first routing aperture located in the center of the plate and a first plurality of elongated apertures located circumferentially around the first routing aperture. The bottom mounting plate has a corresponding second routing aperture in the center of the plate and a second plurality of elongated apertures located circumferentially around the second routing aperture. The top mounting plate is spaced apart a distance from the bottom mounting plate to form an interior space of the module. The inner bracket includes a main body, two mounting plate sections, and two outer cover sections. The main body is generally perpendicular relative to the top and bottom mounting plates and has a central aperture configured to receive and secure a smart meter within the interior space of the module. Each mounting plate section is coupled to opposing ends of the main body and is axially offset relative to the main body by a transition section. Each mounting plate section includes two flanges extending radially outwardly and configured to be received by a respective slot in the top or bottom mounting plate. Each outer cover section is coupled to a respective mounting section and extends generally perpendicularly thereto and includes a plurality of apertures, each aperture configured to receive a fastener. The outer cover is configured to be secured to the inner bracket and sized to extend circumferentially around the interior space of the module. One or more of the elongated apertures of the bottom mounting plate are configured such that the smart meter module can be secured to the top of a mounting pole.

Another aspect of the present invention is directed to a smart meter module assembly. The assembly includes a mounting structure, a smart meter, and a smart meter module. The smart meter module includes a support frame and an outer cover. The support frame includes a top mounting plate, a bottom mounting plate, and an inner bracket between the top and bottom mounting plates and coupled thereto. The top mounting plate has a first routing aperture located in the center of the plate and a first plurality of elongated apertures located circumferentially around the first routing aperture. The bottom mounting plate has a corresponding second routing aperture in the center of the plate and a second plurality of elongated apertures located circumferentially around the second routing aperture. The top mounting plate is spaced apart a distance from the bottom mounting plate to form an interior space of the module. The inner bracket has a central aperture that is generally perpendicular relative to the top and bottom mounting plates and the smart meter is secured within the central aperture. The outer cover is configured to be secured to the inner bracket and sized to extend circumferentially around the interior space of the module. The bottom mounting plate of the smart meter module is secured to the top of the mounting structure.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

DETAILED DESCRIPTION

Figure 1:
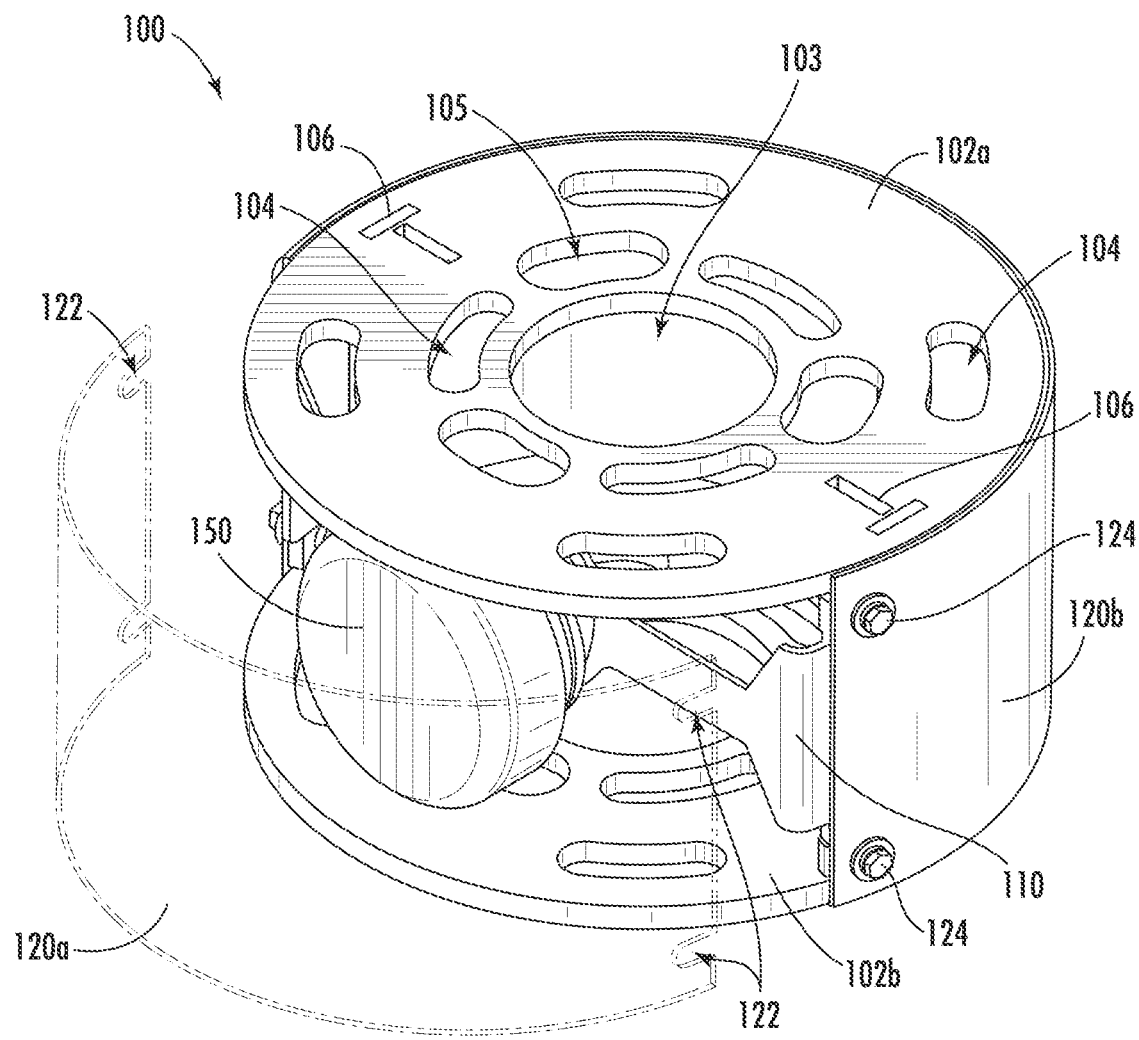
FIG. 1 is a perspective view of a smart meter module (with the front section of the cover removed) according to embodiments of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention now will be described more fully hereinafter with reference to the accompanying drawings, in which illustrative embodiments of the invention are shown. Like numbers refer to like elements throughout and different embodiments of like elements can be designated using a different number of superscript indicator apostrophes (e.g., 10', 10'', 10''').

In the figures, certain layers, components or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Pursuant to embodiments of the present invention, smart meter modules are provided that may be mounted on top of a pole or other like structure. Smart meter module assemblies are also provided. Embodiments of the present invention will now be discussed in greater detail with reference to FIGS. 1-10B.

Referring to FIG. 1-5, a smart meter module 100 according to embodiments of the present invention is illustrated. The smart meter module 100 includes a support frame 130 and an outer cover 120.

Figure 3:
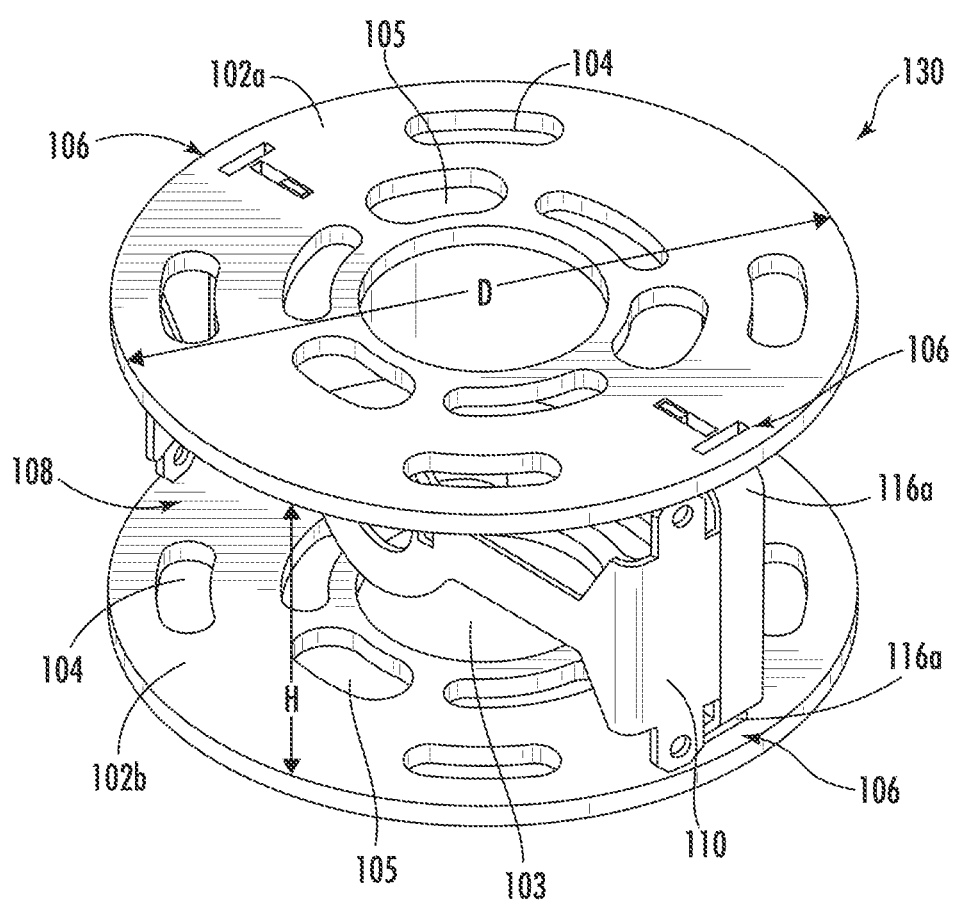
FIG. 3 is a perspective view of the support frame of the smart meter module of FIG. 1 according to embodiments of the present invention.

As shown in FIG. 3, the support frame 130 of the smart meter module 100 comprises an inner bracket 110 between a top mounting plate 102a and a bottom mounting plate 102b. In some embodiments, the inner bracket 110 and mounting plates 102a, 102b are formed from steel, and together, provide the structural support of the smart meter module 100. In some embodiments, the mounting plates 102a, 102b may be circular in shape and may have a diameter in the range of about 8 inches to about 18 inches.

As shown in FIGS. 1 and 3, in some embodiments, the top and bottom mounting plates 102a, 102b each comprise a routing aperture 103 located in the center of each plate 102a, 102b. Each routing aperture 103 is sized and configured such that a plurality of cables 159 may be routed into and/or through interior cavity 108 of the smart meter module 100 (see, e.g., FIGS. 10A-10B).

In some embodiments, the top and bottom mounting plates 102a, 102b further comprise a plurality of mounting apertures 104. The mounting apertures 104 may be elongated slots that extend circumferentially around the routing aperture 103 in each mounting plate 102a, 102b. Each mounting aperture 104 is configured to receive a fastener 132 (e.g., a bolt) (see, e.g., FIGS. 10A-10B). The mounting apertures 104 allow the module 100 to be secured to a mounting structure 170 and allow a piece of telecommunications equipment 160 be secured to the module 100. In some embodiments, the top and bottom mounting plates 102a, 102b may further comprise a plurality of cable apertures 105. Similar to the mounting apertures 104, the cable apertures 105 may be elongated slots that extend circumferentially around the central routing aperture 103 in each mounting plate 102a, 102b. Each cable aperture 105 may be sized and configured such that a cable 159 may be inserted there through (see, e.g., FIGS. 10A-10B). As shown in FIGS. 1 and 3, in some embodiments, the cable apertures 105 may be wider than the mounting apertures 104, for example, to accommodate the diameter of a cable 159 versus the diameter of a bolt (i.e., fastener 132).

Figure 10A:
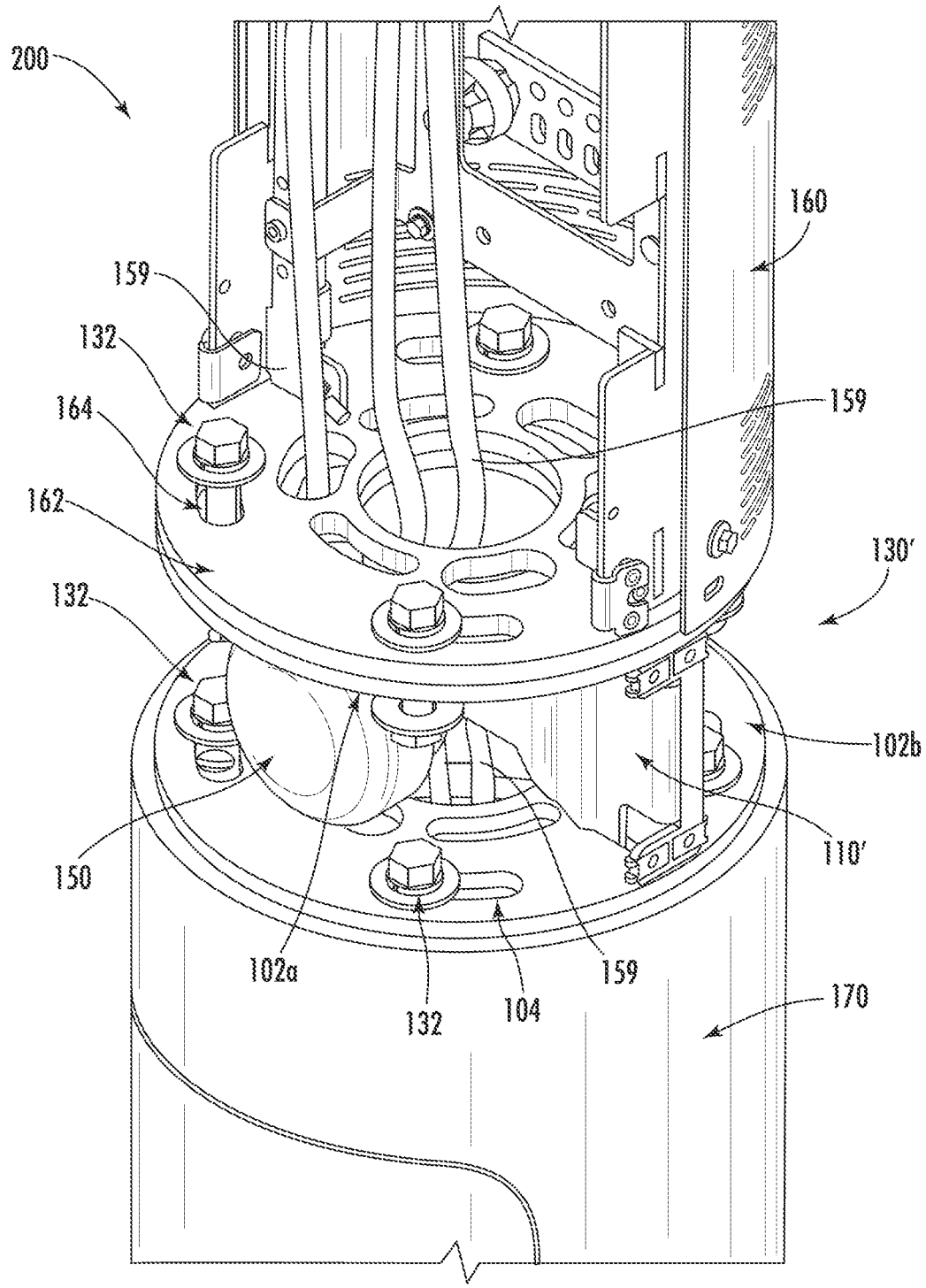
FIG. 10A is a perspective view of a smart meter module assembly (without the outer cover) according to embodiments of the present invention.
Figure 10B:
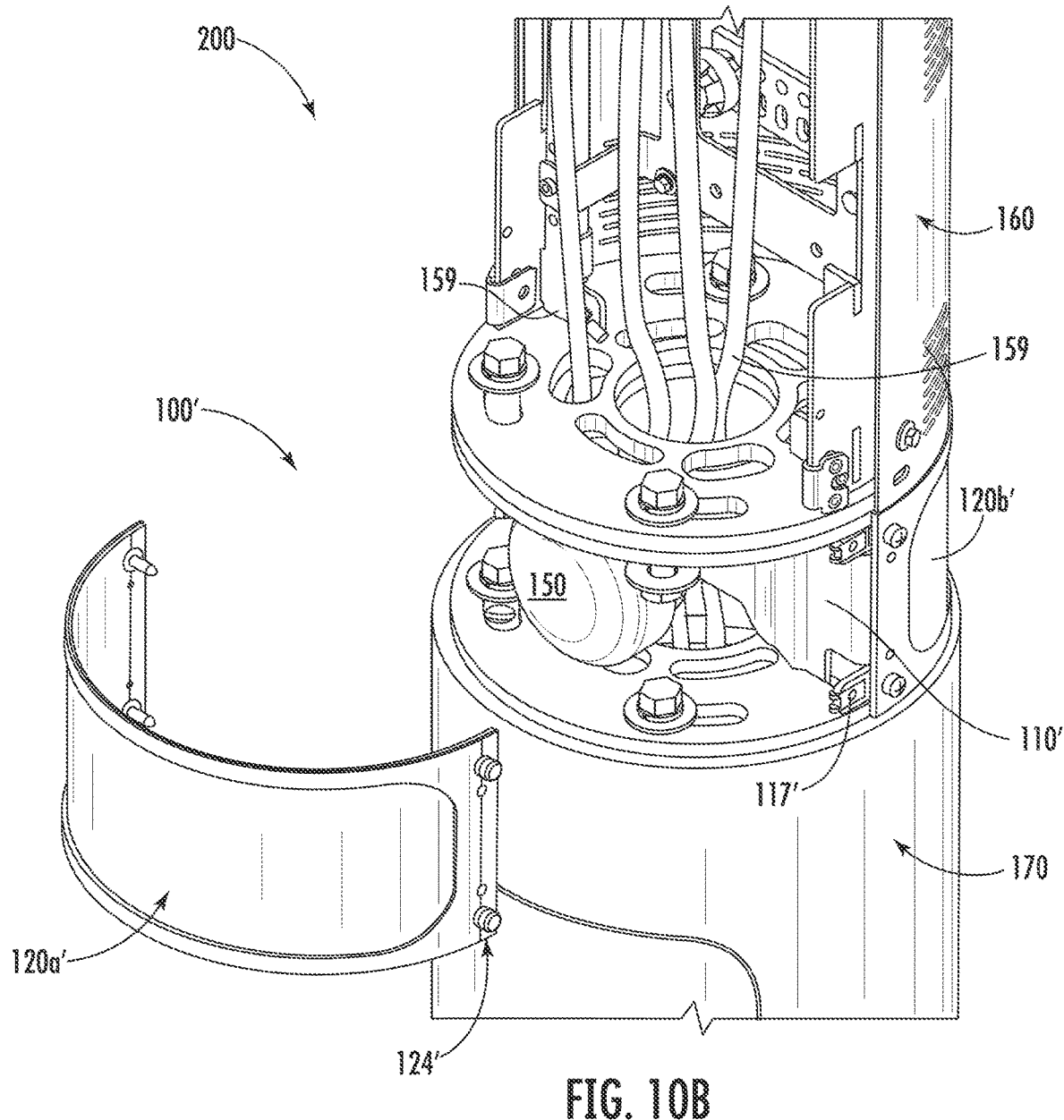
FIG. 10B is a perspective view of the smart meter module assembly of FIG. 10A showing installation of the outer cover.

As shown in FIGS. 10A-10B, the mounting apertures 104 may allow the bottom mounting plate 102b to be secured to a mounting structure 170 (e.g., the top of a pole, such as a monopole) and may allow additional telecommunications equipment 160 to be secured to the top mounting plate 102a. In some embodiments, the elongated shape of the mounting apertures 104 in the top and bottom mounting plates 102a, 102b allows for the compatibility of the smart meter module 100 of the present invention to be secured to different mounting structures 170 and allows different types/sizes of telecommunications equipment 160 to be secured to the smart meter module 100.

The top mounting plate 102a is spaced apart a distance (H) from the bottom mounting plate 102b forming an interior space 108 of the module 100. As shown in FIG. 3, in some embodiments, the distance (H) between the mounting plates 102a, 102b is approximately equal to the height of the inner bracket 110 located therebetween. In some embodiments, the mounting plates 102a, 102b are separated by a distance (H) of about 6 inches to about 12 inches.

Figure 2:
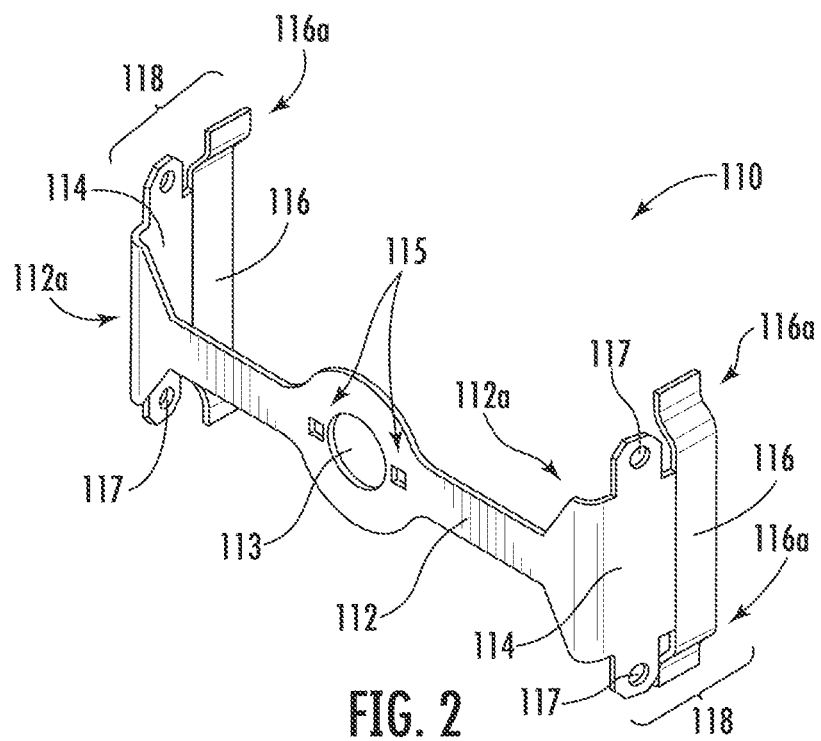
FIG. 2 is a perspective view of the inner bracket for the smart meter module of FIG. 1 according to embodiments of the present invention.
Figure 5:
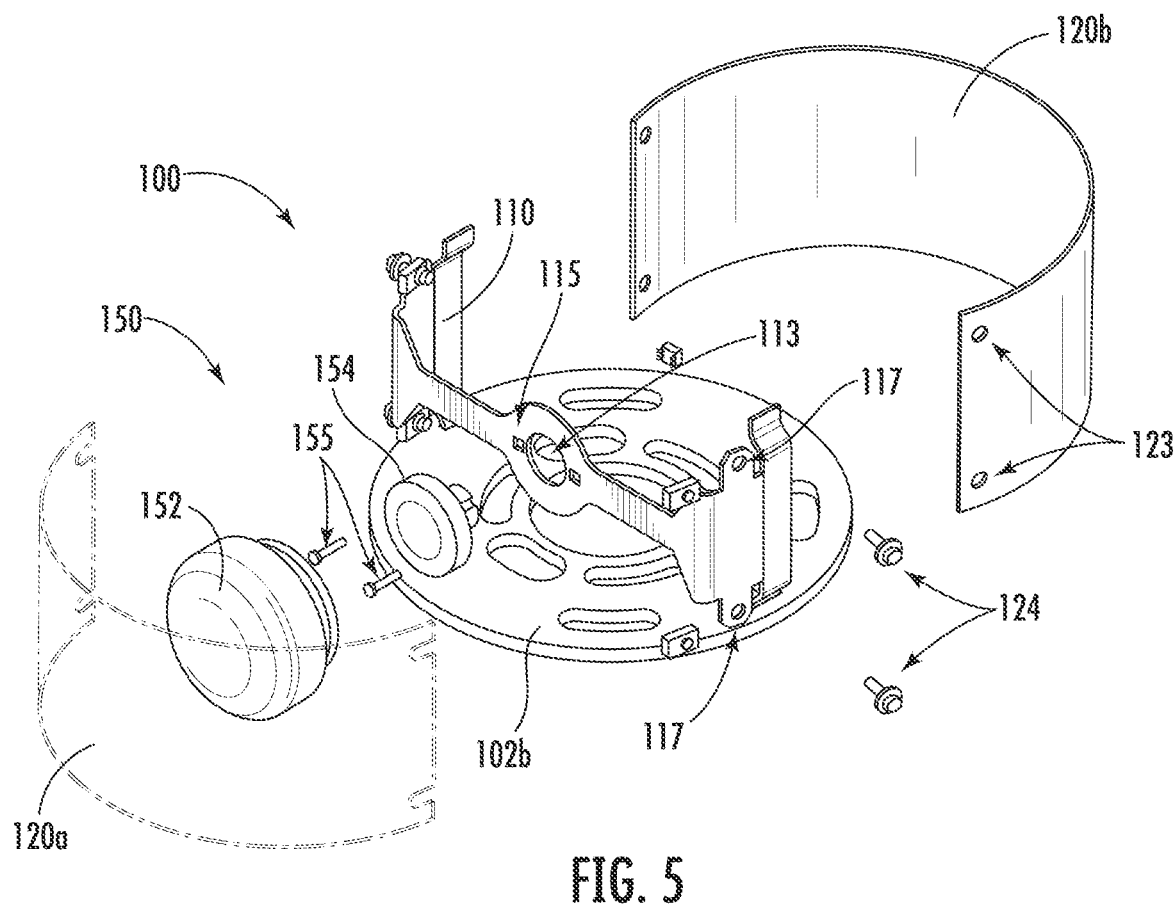
FIG. 5 is a partial exploded view of the smart meter module of FIG. 1.

An exemplary inner bracket 110 of the smart meter module 100 of the present invention is illustrated in FIG. 2. As shown in FIG. 2, in some embodiments, the inner bracket 110 includes a main body 112. The main body 112 extends a length that is slightly less than the diameter (D) of the mounting plates 102a, 102b (see, e.g., FIGS. 3 and 5). The main body 112 of the inner bracket 110 comprises a central aperture 113 that is oriented generally perpendicularly relative to the top and bottom mounting plates 102a, 102b. The central aperture 113 is configured to receive and hold the base end 154 of a smart meter 150 within the interior cavity 108 of the smart meter module 100 (see, e.g., FIG. 5) such that the top end 152 of the smart meter 150 is pointed out towards the outer cover 120 (see, e.g., FIG. 1). The main body 112 of the inner bracket 110 may also comprise one or more smaller holes 115 adjacent to the central aperture 113. As shown in FIG. 5, these smaller holes 115 may be sized and configured to receive a respective fastener 155 (e.g., a screw) such that the smart meter 150 may be secured to the inner bracket 110 and held within the interior cavity 108 of the smart meter module 100. Note that, in some embodiments, the central aperture 113 (and module 100) may be configured to receive and hold other similar radio or IoT transmitters.

Still referring to FIG. 2, the inner bracket 100 may further comprise two arms 118 that extend rearwardly and generally perpendicularly from opposing ends of the main body 112. In some embodiments, the main body 112 and arms 118 of the inner bracket 110 may be monolithic. For example, in some embodiments, the inner bracket 110 may be formed of steel in which the main body 112 is bent at the transition areas 112a to from the arms 118 of the inner bracket 110.

As shown in FIG. 2, in some embodiments, each arm 118 of the inner bracket 110 may comprise an outer cover section 114 and a mounting plate section 116 (i.e., sections that provide a location to fasten the outer cover 120 and the mounting plates 102a, 102b to the inner bracket 110). In some embodiments, the outer cover section 114 of the inner bracket 110 may comprise a plurality of apertures 117. For example, as shown in FIG. 2, in some embodiments, each outer cover section 114 may comprise two apertures 117 with each aperture 117 being located at opposing ends of the outer cover section 114. Each of the apertures 117 may be sized and configured to receive a respective fastener 124 (e.g., a screw) which, as discussed in further detail below, provides a location for the outer cover 120 to be secured to the inner bracket 110 of the smart meter module 110 (see, e.g., FIGS. 1, 4 and 5).

With regards to the mounting plate sections 116 of the inner bracket 110, in some embodiments, each mounting plate section 116 may comprise two flanges 116a with each flange 116a being located at opposing ends of the mounting plate section 116 (and adjacent to the apertures 117 of the outer cover section 114). Each flange 116a may be sized and configured to be received by a respective slot 106 in the top or bottom mounting plates 102a, 102b such that the inner bracket 110 may be secured between the top and bottom mounting plates 102a, 102b. In some embodiments, the flanges 116a may be configured to flex slightly inward to allow the flanges 116a to be inserted into a respective slot 106 in the top and bottom mounting plates 102a, 102b. When received by a respective slot 106, the flange 116a may exert a force radially outwardly against an inner surface of the slot 106 that holds the flange 116a within the slot 106, thereby securing the inner bracket 110 to the top and bottom mounting plates 102a, 102b. In some embodiments, the flanges 116a may be welded to the top and bottom mounting plates 102a, 102b to secure the inner bracket 110 to the top and bottom mounting plates 102a, 102b and form the support frame 130 of the smart meter module 100.

Figure 4:
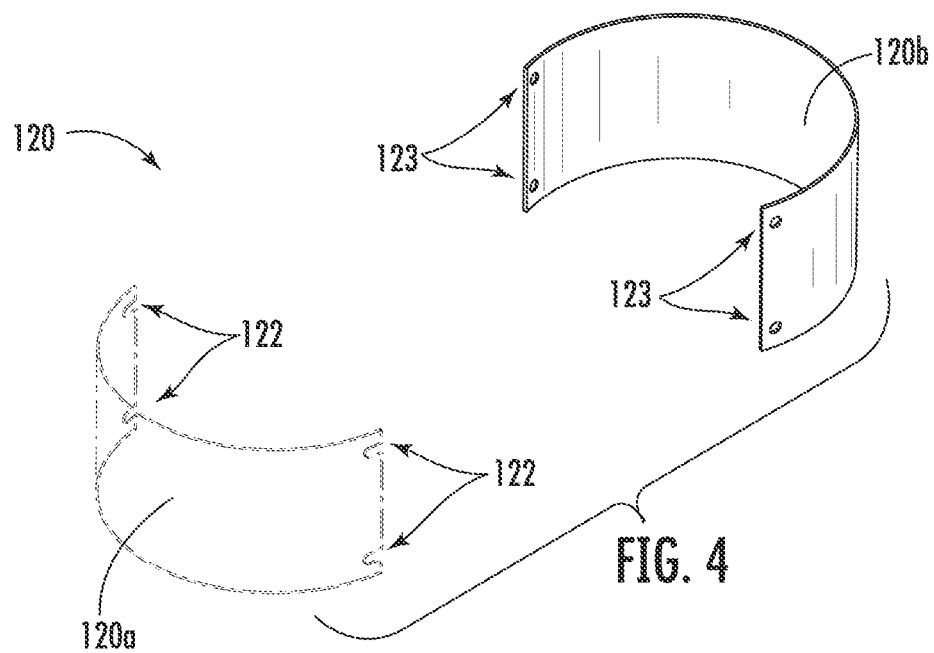
FIG. 4 is a perspective view of the two sections of the outer cover of the smart meter module of FIG. 1 according to embodiments of the present invention.

Referring to FIG. 4, an outer cover 120 that may be used with the smart meter module 100 of the present invention is illustrated. The outer cover 120 is configured to be secured to the inner bracket 110 and is sized to extend circumferentially around the interior space 108 of the module 100. The outer cover 120 has a height that is approximately equal to the distance (H) between the mounting plates 102a, 102b (see, e.g., FIG. 1). The outer cover 120 helps to protect a smart meter 150 secured within the module 100 from environmental conditions, such as, rain and snow.

As shown in FIGS. 4 and 5, in some embodiments, the outer cover 120 may be divided into a front section 120a and a back section 120b. In some embodiments, each section 120a, 120b may have an arcuate shape such that together the sections 120a, 120b extend circumferentially around the module 100. As shown in FIG. 4, in some embodiments, the sections 120a, 120b may be divided as two "halves" of the outer cover 120 (i.e., being approximately equal in size). In some embodiments, the outer cover 120 may not be equally divided into two sections 120a, 120b (or halves). For example, in some embodiments, the front section 120a may make up a third of the cover 120 and the back section 120b may make up the remaining two-thirds of the cover 120 or visa versa.

In some embodiments, the back section 120b of the cover 120 may comprise a plurality of apertures 123. The apertures 123 are positioned such that when the back section 120b of the cover 120 is placed on the smart meter module 100, each aperture 123 aligns with a respective aperture 117 located in the outer cover section 114 of the inner bracket 110. Therefore, typically, the number of apertures 123 in the back section 120b of the cover 120 is equal to the number of apertures 117 in the inner bracket 110. Similar to each aperture 117 of the inner bracket 110, the apertures 123 of the back section 120b of the cover 120 are sized and configured to receive a respective fastener 124. This allows the back section 120b of the cover 120 to be secured to the inner bracket 110 of the smart meter module 100 by fasteners 124 (e.g., a screws) that are inserted through the aligned apertures 123, 117 in the back section 120b of the cover 120 and the outer cover section 114 of the inner bracket 110. In some embodiments, the apertures 117 in the inner bracket 110 are threaded to receive and hold the fasteners 124.

Still referring to FIGS. 4 and 5, in some embodiments, the front section 120a of the cover 120 may comprise a plurality of recesses 122. The recesses 122 are positioned in the front section 120a of the cover such that each recess 122 aligns with a corresponding aperture 123 in the back section 120b of the cover 120. Each recess 122 is sized and configured to receive a respective fastener 124 which allows the front section 120a to be slid onto the support frame 130 of the smart meter module 100. During assembly of the smart meter module 100, in some embodiments, the fasteners 124 secure the back section 120b of the cover to the inner bracket 110 as described herein, but are not fully tightened. This allows room to slide the front section 120a of the cover 120 (via the recesses 122) onto the fasteners 124. Once the front section 120a is slid onto the fasteners 124, each fastener 124 may then be fully tightened, thereby securing both the front section 120a and the back section 120b of the cover 120 to the inner bracket 110 (i.e., the support frame 130 of the smart meter module 100).

At least a portion of the cover 120 should be formed from a radio frequency compatible material to allow for wireless transmission of the information collected by the smart meter 150. In some embodiments, the back section 120b of the cover 120 may be formed of a metallic material (i.e., a non-radio frequency penetrating or compatible material) and the front section 120a of the cover 120 may be formed of a non-metallic, radio frequency transparent material. For example, in some embodiments, the back section 120b of the cover 120 may be formed of steel and the front section 120a of the cover 120 may be formed of a polymeric material (examples include, but are not limited to, Polycarbonate, PC/ABS, and ABS Centrex).

Figure 6:
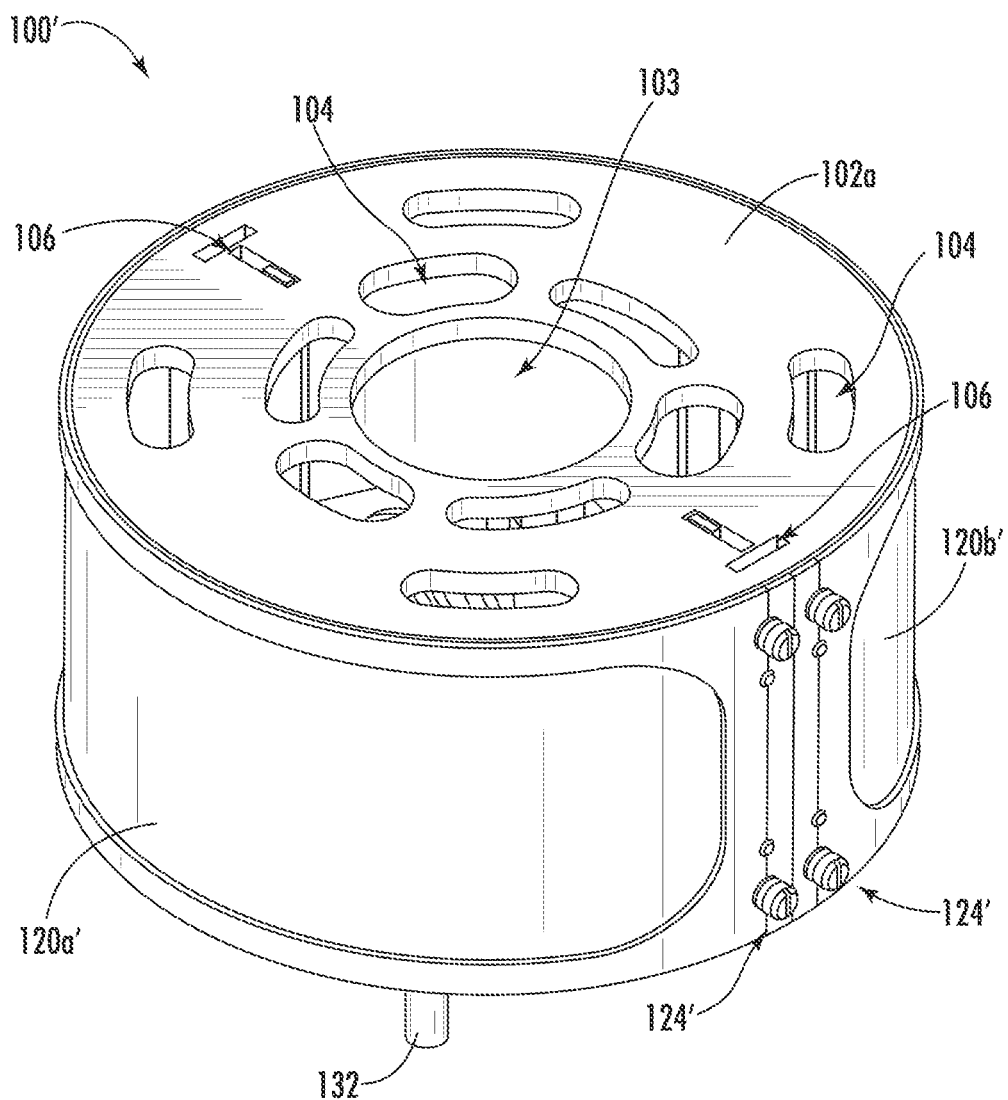
FIG. 6 is a perspective view of an alternative smart meter module according to embodiments of the present invention.
Figure 7A:
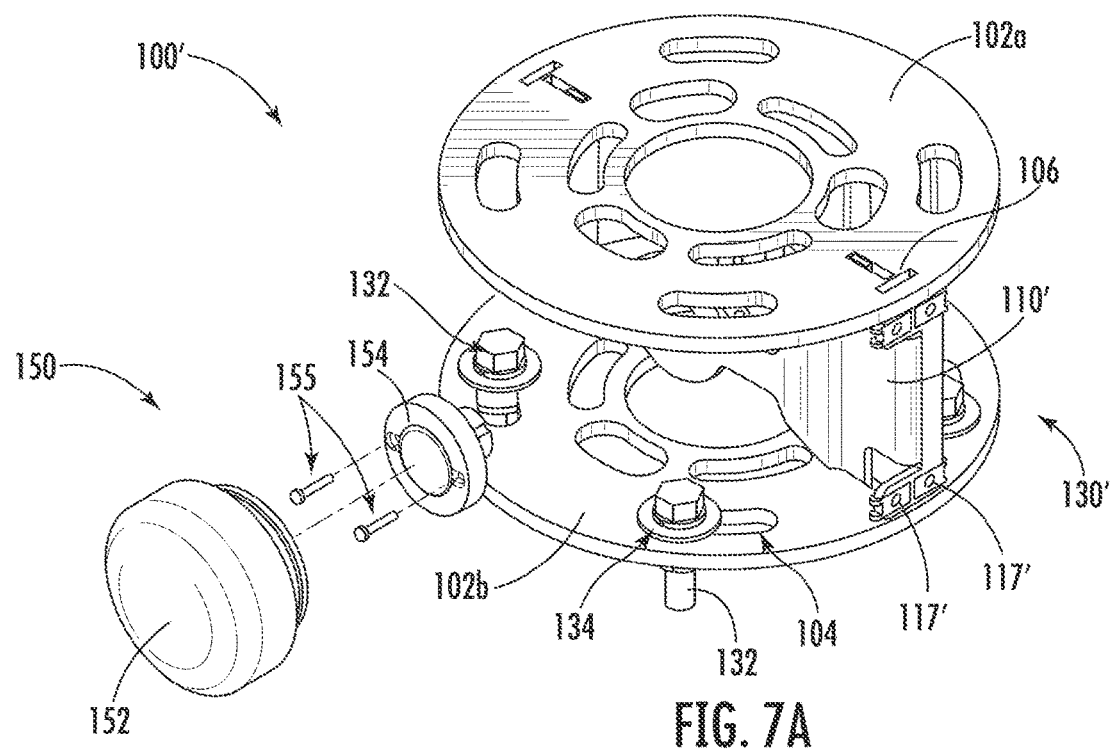
FIG. 7A is a front exploded view of the smart meter module of FIG. 6 without the outer cover.
Figure 7B:
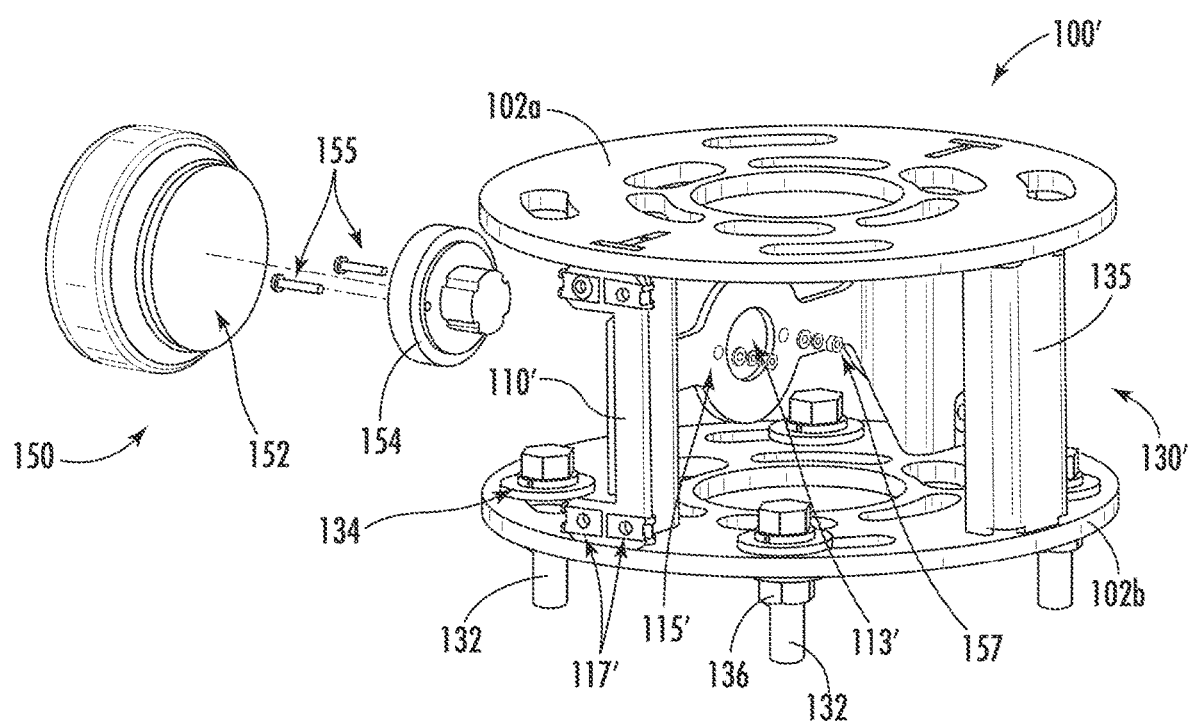
FIG. 7B is a rear exploded view of the smart meter module of FIG. 6 without the outer cover.
Figure 8A:
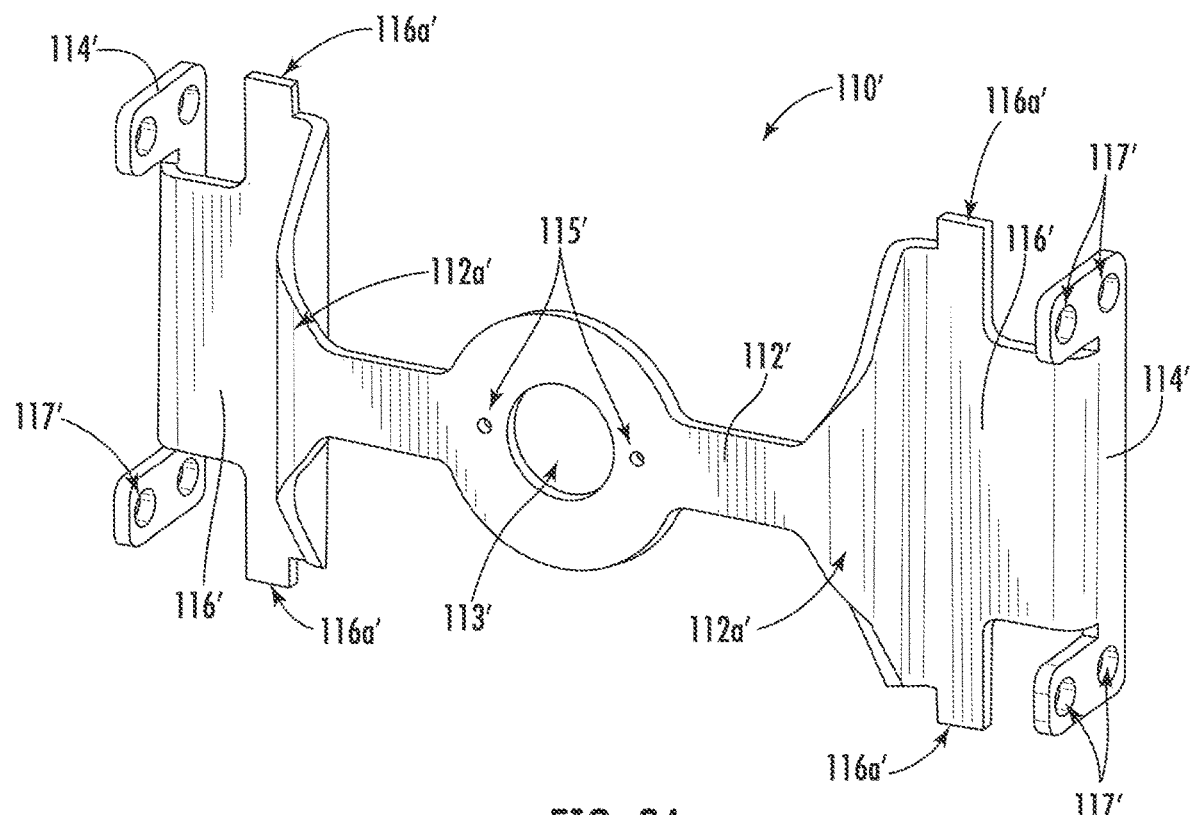
FIG. 8A is a perspective view of the inner bracket for the smart meter module of FIG. 6 according to embodiments of the present invention.
Figure 8B:
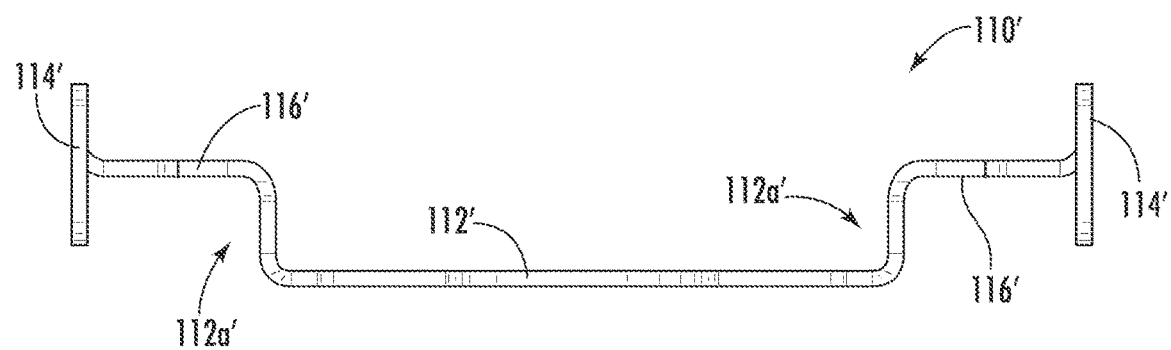
FIG. 8B is a top view of the inner bracket of FIG. 8A.
Figure 9A:
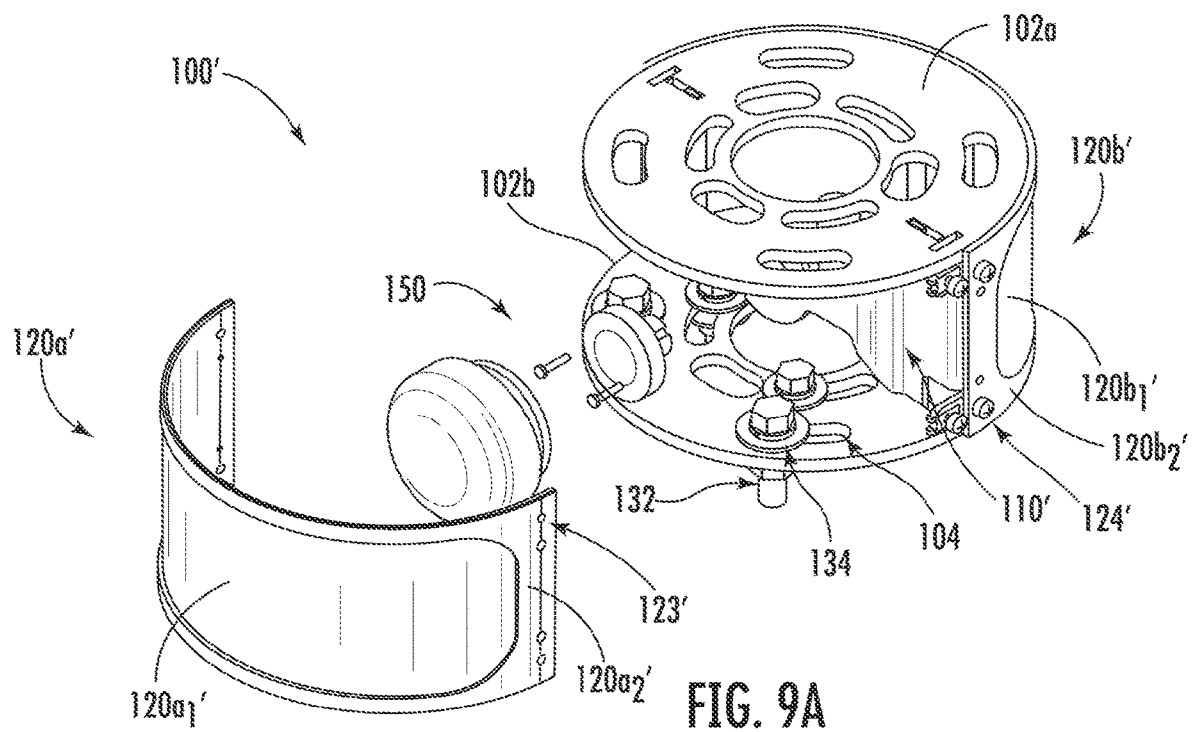
FIG. 9A is a partial exploded view of the smart meter module of FIG. 6.
Figure 9B:
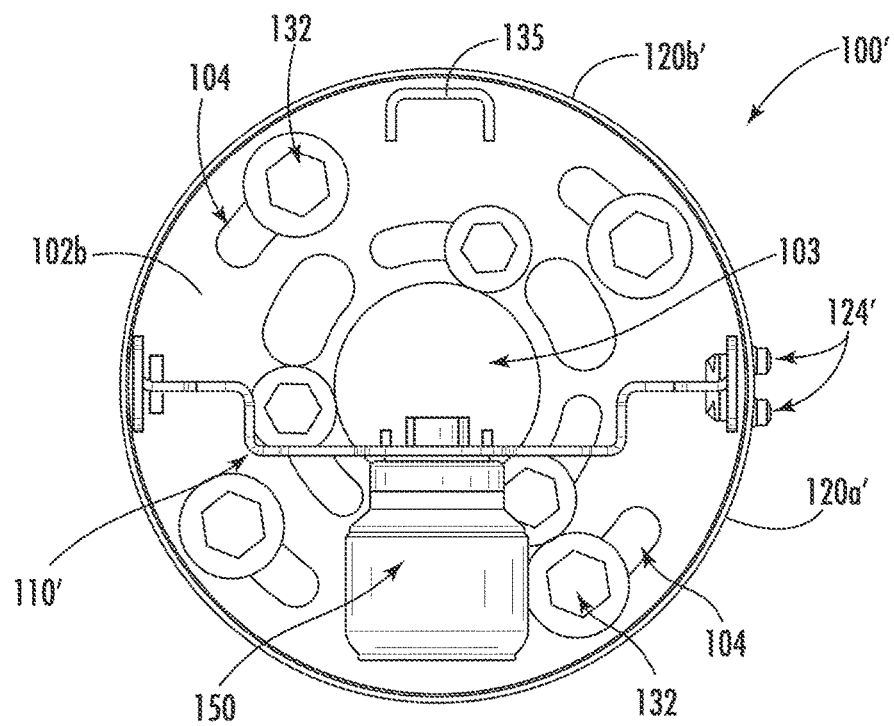
FIG. 9B is a top view of the smart meter module of FIG. 6 with the top mounting plate removed.

Referring now to FIGS. 6-9B, an alternative smart meter module 100' according to embodiments of the present invention is illustrated. As shown in FIGS. 6-7B, the smart meter module 100' is similar to the smart meter module 100 described herein, and includes a support frame 130' and an outer cover 120'. The support frame 130' provides the structural support to the smart meter module 100 of the present invention and the outer cover 120' helps to protect a smart meter 150 secured within the interior cavity 108 of the module 100' (e.g., protection from environmental conditions). The support frame 130' of the smart meter module 100' comprises the same top and bottom mounting plates 102a, 102b, but the inner bracket 110' of the support frame 130' differs slightly from the inner bracket 110 described herein. In some embodiments, the support frame 130' may further comprise a support member 135 between the top and bottom mounting plates 102a, 102b (see, e.g., FIGS. 7B and 9B). As shown in FIGS. 7B and 9B, the support member 135 may be located in the rear of the module 100' (i.e., opposite from the front end 152 of the smart meter 150).

Referring to FIGS. 8A-8B, an exemplary inner bracket 110' for the smart meter module 100' is illustrated. As shown in FIGS. 8A-8B, the inner bracket 110' comprises a main body 112'. Similar to the main body 112 of inner bracket 110 described herein, the main body 112' of inner bracket 112' extends a length that is approximately equal to the diameter (D) of the mounting plates 102a, 102b (see, e.g., FIG. 9B). Also similar to the main body 112 of inner bracket 110, the main body 112' of the inner bracket 110' comprises a central aperture 113' that is oriented generally perpendicular relative to the top and bottom mounting plates 102a, 102b such that the top end 152 of the smart meter 150 will point outwardly towards the outer cover 120'. The central aperture 113' is configured to receive and hold a base 154 of a smart meter 150 within the interior cavity 108 of the smart meter module 100' (see, e.g., FIGS. 7A-7B and 9B).

The main body 112' of the inner bracket 110' may also comprise one or more smaller holes 115' adjacent to the central aperture 113'. As shown in FIGS. 7A-7B, these smaller holes 115' may be sized and configured to receive a respective fastener 155 (e.g., a screw) such that the smart meter 150 may be secured to the inner bracket 110' within the interior cavity 108 of the smart meter module 100'.

Similar to the inner bracket 110, in some embodiments, the inner bracket 110' may comprise an outer cover section 114' and a mounting plate section 116' (i.e., sections that provide locations to fasten the outer cover 120' and the mounting plates 102a, 102b to the inner bracket 110'), however, these sections 114', 116' are configured and oriented slightly different than the inner bracket 110. As shown in FIGS. 7A-7B, each mounting plate section 116' of the inner bracket 110' is coupled to opposing ends of the main body 112' and are axially offset relative to the main body 112' by a transition section 112a' (see, e.g., FIG. 7B). Similar to mounting plate section 116 of the inner bracket 110 described herein, and as shown in FIG. 8A, each mounting plate section 116' of inner bracket 110' comprises two flanges 116a' that each extend radially outwardly from opposing sides of the mounting plate section 116'. Each flange 116a' is sized and configured to be received by a respective slot 106 in the top or bottom mounting plate 102a, 102b (see, e.g., FIGS. 7A-7B). In some embodiments, once received by the slots 106, the flanges 116a' may be welded to the top and bottom mounting plates 102a, 102b to secure the inner bracket 110' to the top and bottom mounting plates 102a, 102b and form the support frame 130' of the smart meter module 100'. Note that, in some embodiments, the central aperture 113' (and module 100') may be configured to receive and hold other similar radio or IoT transmitters.

Similar to the outer cover section 114 of the inner bracket 110 described herein, each outer cover section 114' of inner bracket 110' comprises a plurality of apertures 117'. As shown in FIG. 8A, in some embodiments, each outer cover section 114 may comprise four apertures 117' with two apertures 117' being located at each opposing end of the outer cover section 114'. Each of the apertures 117' may be sized and configured to receive a respective fastener 124 (e.g., a screw) which provides a location for the outer cover 120' to be secured to the inner bracket 110' of the smart meter module 110' (see, e.g., FIGS. 6 and 9A-9B).

As shown in FIGS. 6, 9A, and 10B, similar to the outer cover 120 described herein, in some embodiments, the outer cover 120' may be divided into a front section 120a' and a back section 120b'. In some embodiments, each section 120a', 120b' may have an arcuate shape such that together the sections 120a', 120b' extend circumferentially around the module 100, 100'. In some embodiments, both the front section 120a' and the back section 120b' of the cover 120 may comprise a plurality of apertures 123'. Similar to the apertures 123 of cover 120, the apertures 123' are positioned such that when the front and back sections 120a', 120b' of the cover 120 are placed on the smart meter module 100', each aperture 123' aligns with a respective aperture 117' located in the outer cover section 114' of the inner bracket 110'. The apertures 123' are sized and configured to receive a respective fastener 124. Thus, the front and back sections 120a', 120b' of the cover 120' may be secured to the inner bracket 110' when fasteners 124 (e.g., a screws) are inserted through the aligned apertures 123', 117' in the front and back sections 120a', 120b' of the cover 120' and the outer cover section 114' of the inner bracket 110'.

In some embodiments, the front section 120a' and/or the back section 120b' of the cover 120' may comprise both a non-metallic section $120a_1$' and metallic section $120a_2$'. For example, as shown in FIG. 9A, in some embodiments, the outer periphery (or frame) $120a2$' of the front and/or back section 120a', 120b' of the cover 120' may be formed of a metallic material and the central area $120a_1$' within the frame $120a_2$' of the front and/or back section 120a', 120b' may be formed of non-metallic or polymeric material. Forming the outer periphery $120a_2$' from a metallic material may provide additional structural support to the cover 120' when securing the cover 120' to the inner bracket 110' of the smart meter module 100'. The non-metallic section $120a_1$' provides that at least a portion of the cover 120' is radio frequency compatible (or transparent) such that the smart meter 150 secured within the module 100, 100' is able to wirelessly transmit the information collected.

FIGS. 10A-10B illustrate a smart meter module assembly 200 according to embodiments of the present invention. As shown in FIGS. 10A-10B, the smart meter module assembly 200 comprises the smart meter module 100' described herein secured to the top of a mounting structure 170 (e.g., a pole) via bolts 132 which are inserted through the slots 104 in the bottom mounting plate 102b. Note that the smart meter module 100 described herein may be secured to the top of the mounting structure 170 in the same manner.

As further shown in FIGS. 10A-10B, in some embodiments, the smart meter module assembly 200 may also comprise an additional piece of telecommunications equipment 160 (e.g., an antenna or radio) that is secured to the top of the smart meter module 100' via bolts 132. The bolts 132 may be inserted through slots 164 located in a bottom mounting plate 162 of the telecommunications equipment 160 and received by slots 104 in the top mounting plate 102a of the smart meter module 100' to secure the equipment 160 on top of the module 100'. Note that telecommunications equipment 160 may be secured to the top of the smart meter module 100 described herein in the same manner.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A smart meter module, comprising:
   a support frame, the support frame comprising:
   a top mounting plate having a first routing aperture located in the center of the plate and a first plurality of elongated apertures located circumferentially around the first routing aperture;
   a bottom mounting plate having a corresponding second routing aperture in the center of the plate and a second plurality of elongated apertures located circumferentially around the second routing aperture, wherein the top mounting plate is spaced apart a distance from the bottom mounting plate to form an interior space of the smart meter module; and
   an inner bracket between the top and bottom mounting plates and coupled thereto, the inner bracket having a central aperture that is generally perpendicular relative to the top and bottom mounting plates and configured to receive and secure a smart meter within the interior space of the smart meter module; and
   an outer cover configured to be secured to the inner bracket and sized to extend circumferentially around the interior space of the smart meter module,
   wherein one or more of the elongated apertures of the bottom mounting plate are configured such that the smart meter module can be secured to the top of a mounting pole.

2. The smart meter module of claim 1, wherein the inner bracket further comprises:
   a main body comprising the central aperture; and
   two arms extending rearwardly and generally perpendicularly from opposing ends of the main body, each arm comprising:

an outer cover section comprising a plurality of apertures, each aperture configured to receive a fastener; and a mounting plate section comprising two flanges extending radially outwardly, each flange configured to be received by a respective slot in the top or bottom mounting plate.

3. The smart meter module of claim 1, wherein the inner bracket further comprises:

a main body comprising the central aperture;

two mounting plate sections, each mounting plate section coupled to opposing ends of the main body and is axially offset relative to the main body by a transition section, wherein each mounting plate section comprises two flanges extending radially outwardly and configured to be received by a respective slot in the top or bottom mounting plate; and two outer cover sections, each outer cover section coupled to a respective mounting section and extending generally perpendicularly thereto, wherein each outer cover section comprises a plurality of apertures, each aperture configured to receive a fastener.

4. The smart meter module of claim 1, wherein the outer cover is divided into a front arcuate section and a back arcuate section, the back section comprising a plurality of apertures, each aperture configured to receive a fastener that secures the back section of the outer cover to the cover section of the inner bracket of the support frame, and the front section comprising a plurality of recesses, each recess is configured to receive a respective fastener when the front section is slid onto the support frame, thereby securing the front section of the outer cover to the back section of the outer cover.

5. The smart meter module of claim 4, wherein the front section of the outer cover is formed of a non-metallic, radio frequency penetrating material and the back section of the outer cover is formed of a metallic material.

6. The smart meter module of claim 4, wherein the front section of the outer cover is formed of a polymeric material and the back section of the outer cover is formed of steel.

7. The smart meter module of claim 1, wherein the outer cover is divided into a front arcuate section and a back arcuate section, each section comprising a plurality of apertures that are each configured to receive a respective fastener that secures each section of the outer cover to the cover section of the inner bracket of the support frame.

8. The smart meter module of claim 1, wherein the outer cover comprises a radio frequency transparent material.

9. The smart meter module of claim 1, wherein one or more of the elongated apertures of the top mounting plate are configured such that additional telecommunications equipment can be secured on top of the smart meter module.

10. A smart meter module, comprising:

a support frame, the support frame comprising:

a top mounting plate having a first routing aperture located in the center of the plate and a first plurality of elongated apertures located circumferentially around the first routing aperture;

a bottom mounting plate having a corresponding second routing aperture in the center of the plate and a second plurality of elongated apertures located circumferentially around the second routing aperture, wherein the top mounting plate is spaced apart a distance from the bottom mounting plate to form an interior space of the smart meter module; and an inner bracket between the top and bottom mounting plates and coupled thereto, the inner bracket comprising:

a main body generally perpendicular relative to the top and bottom mounting plates, the main body having a central aperture configured to receive and secure a smart meter within the interior space of the smart meter module;

two mounting plate sections, each mounting plate section coupled to opposing ends of the main body and is axially offset relative to the main body by a transition section, wherein each mounting plate section comprises two flanges extending radially outwardly and configured to be received by a respective slot in the top or bottom mounting plate; and two outer cover sections, each outer cover section coupled to a respective mounting section and extending generally perpendicularly thereto, wherein each outer cover section comprises a plurality of apertures, each aperture configured to receive a fastener; and an outer cover configured to be secured to the inner bracket and sized to extend circumferentially around the interior space of the smart meter module, wherein one or more of the elongated apertures of the bottom mounting plate are configured such that the smart meter module can be secured to the top of a mounting pole.

11. The smart meter module of claim 10, wherein the outer cover is divided into a front arcuate section and a back arcuate section, the back section comprising a plurality of apertures, each aperture configured to receive a fastener that secures the back section of the outer cover to the cover section of the inner bracket of the support frame, and the front section comprising a plurality of recesses, each recess is configured to receive a respective fastener when the front section is slid onto the support frame, thereby securing the front section of the outer cover to the back section of the outer cover.

12. The smart meter module of claim 11, wherein the front section of the outer cover is formed of a non-metallic, radio frequency penetrating material and the back section of the outer cover is formed of a metallic material.

13. The smart meter module of claim 11, wherein the front section of the outer cover is formed of a polymeric material and the back section of the outer cover is formed of steel.

14. The smart meter module of claim 10, wherein the outer cover is divided into a front arcuate section and a back arcuate section, each section comprising a plurality of apertures that are each configured to receive a respective fastener that secures each section of the outer cover to the cover section of the inner bracket of the support frame.

15. The smart meter module of claim 10, wherein the outer cover comprises a radio frequency transparent material.

16. A smart meter module assembly, comprising:

a mounting structure;

a smart meter; and a smart meter module, the smart meter module comprising:

a support frame, the support frame comprising:

a top mounting plate having a first routing aperture located in the center of the plate and a first plurality of elongated apertures located circumferentially around the first routing aperture;

a bottom mounting plate having a corresponding second routing aperture in the center of the plate and a second plurality of elongated apertures located circumferentially around the second routing aperture, wherein the top mounting plate is spaced apart a distance from the bottom mounting plate to form an interior space of the smart meter module; and an inner bracket between the top and bottom mounting plates and coupled thereto, the inner bracket having a central aperture that is generally perpendicular relative to the top and bottom mounting plates, wherein the smart meter is secured within the central aperture; and an outer cover configured to be secured to the inner bracket and sized to extend circumferentially around the interior space of the smart meter module, wherein the bottom mounting plate of the smart meter module is secured to the top of the mounting structure.

17. The smart meter module assembly of claim 16, further comprising telecommunications equipment secured to the top mounting plate of the smart meter module.

18. The smart meter module assembly of claim 16, wherein the mounting structure is a pole.

19. The smart meter module assembly of claim 16, wherein the inner bracket of the smart meter module further comprises:

a main body comprising the central aperture; and two arms extending rearwardly and generally perpendicularly from opposing ends of the main body, each arm comprising:

an outer cover section comprising a plurality of apertures, each aperture configured to receive a fastener; and a mounting plate section comprising two flanges extending radially outwardly, each flange configured to be received by a respective slot in the top or bottom mounting plate.

20. The smart meter module assembly of claim 16, wherein the inner bracket of the smart meter module further comprises:

a main body comprising the central aperture;

two mounting plate sections, each mounting plate section coupled to opposing ends of the main body and is axially offset relative to the main body by a transition section, wherein each mounting plate section comprises two flanges extending radially outwardly and configured to be received by a respective slot in the top or bottom mounting plate; and two outer cover sections, each outer cover section coupled to a respective mounting section and extending generally perpendicularly thereto, wherein each outer cover section comprises a plurality of apertures, each aperture configured to receive a fastener.

* * * * *